United States Patent
Nandakumar et al.

(10) Patent No.: US 6,479,339 B2
(45) Date of Patent: Nov. 12, 2002

(54) USE OF A THIN NITRIDE SPACER IN A SPLIT GATE EMBEDDED ANALOG PROCESS

(75) Inventors: Mahalingam Nandakumar, Plano, TX (US); Amitava Chatterjee, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/967,207

(22) Filed: Sep. 28, 2001

(65) Prior Publication Data

US 2002/0042166 A1 Apr. 11, 2002

Related U.S. Application Data

(60) Provisional application No. 60/239,050, filed on Oct. 10, 2000.

(51) Int. Cl.[7] .................................... H01L 21/8238
(52) U.S. Cl. ................. 438/232; 438/199; 438/231; 438/275; 438/279; 438/527; 257/392; 257/500
(58) Field of Search ........................ 438/199, 231, 438/232, 279, 275, 527, 200, 258; 257/357, 392, 500

(56) References Cited

U.S. PATENT DOCUMENTS

| 5,534,449 A | * | 7/1996 | Dennison et al. ........... 438/231 |
| 6,137,144 A | * | 10/2000 | Tsao et al. .................. 257/357 |
| 6,258,644 B1 | * | 7/2001 | Rodder et al. .............. 438/199 |
| 6,413,824 B1 | * | 7/2002 | Chatterjee et al. .......... 438/232 |

* cited by examiner

Primary Examiner—Carl Whitehead, Jr.
Assistant Examiner—Jeff Vockrodt
(74) Attorney, Agent, or Firm—Peter K. McLarty; W. James Brady, III; Frederick J. Telecky, Jr.

(57) ABSTRACT

A mixed voltage CMOS process for high reliability and high performance core transistors and input-output and analog transistors with reduced mask steps. A patterned silicon nitride film 160 is used to selectively mask various implant species during the formation of the LDD regions 180, 220, and the pocket regions 190, 230 of the core transistors 152, 154. The LDD regions 240, 200 of the I/O or analog transistors 156, 158 are simultaneously formed during the process.

18 Claims, 5 Drawing Sheets

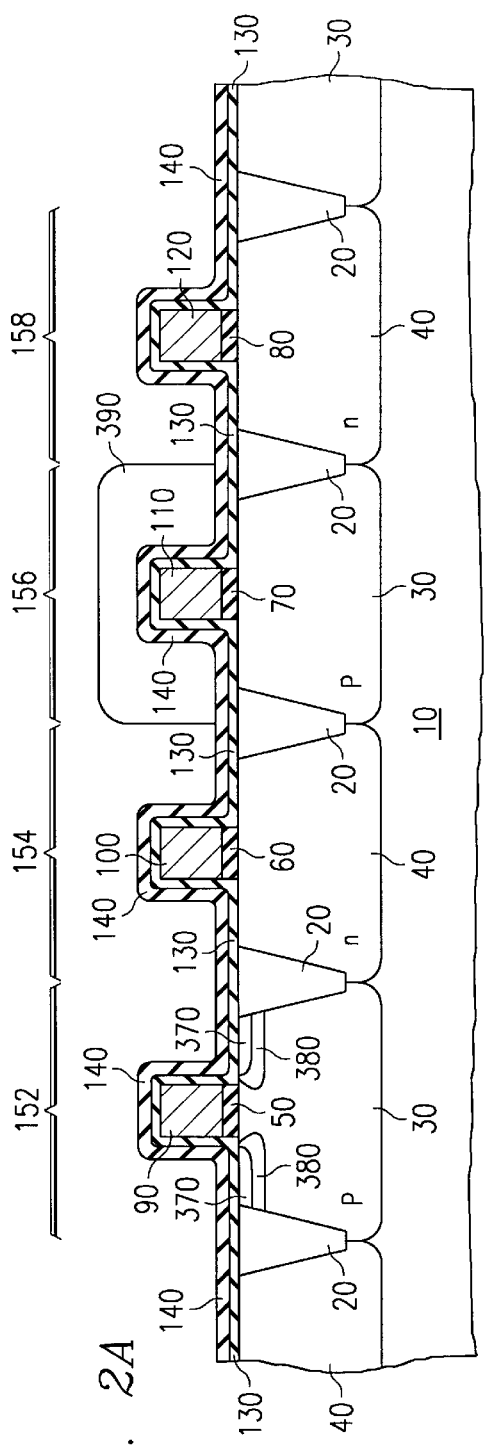
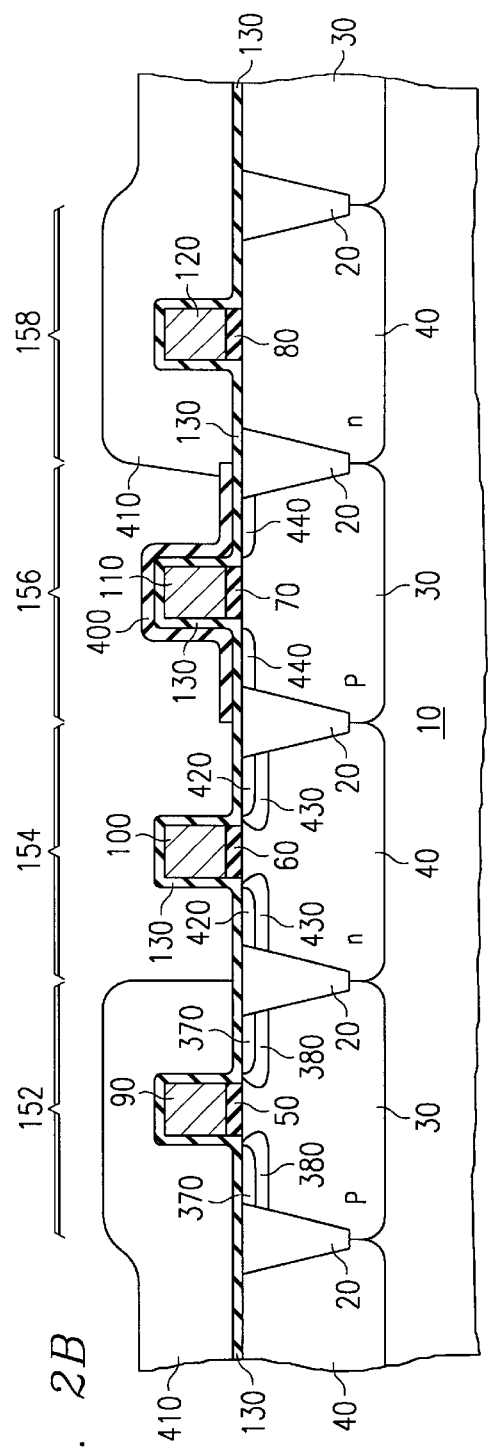
FIG. 2A
FIG. 2B

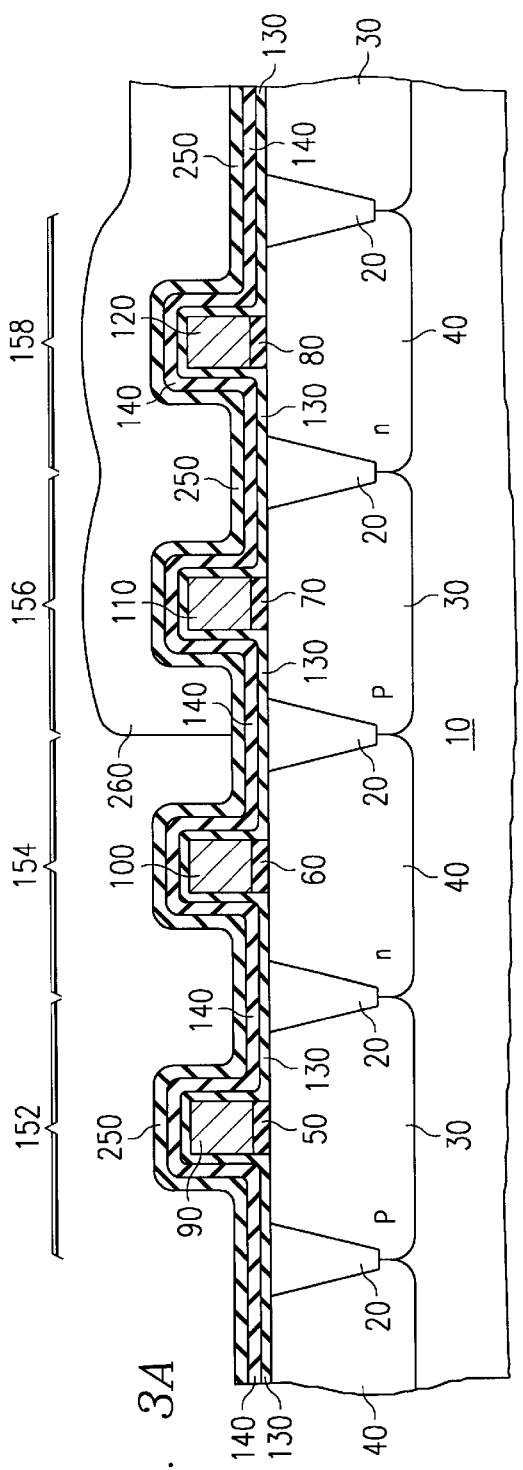
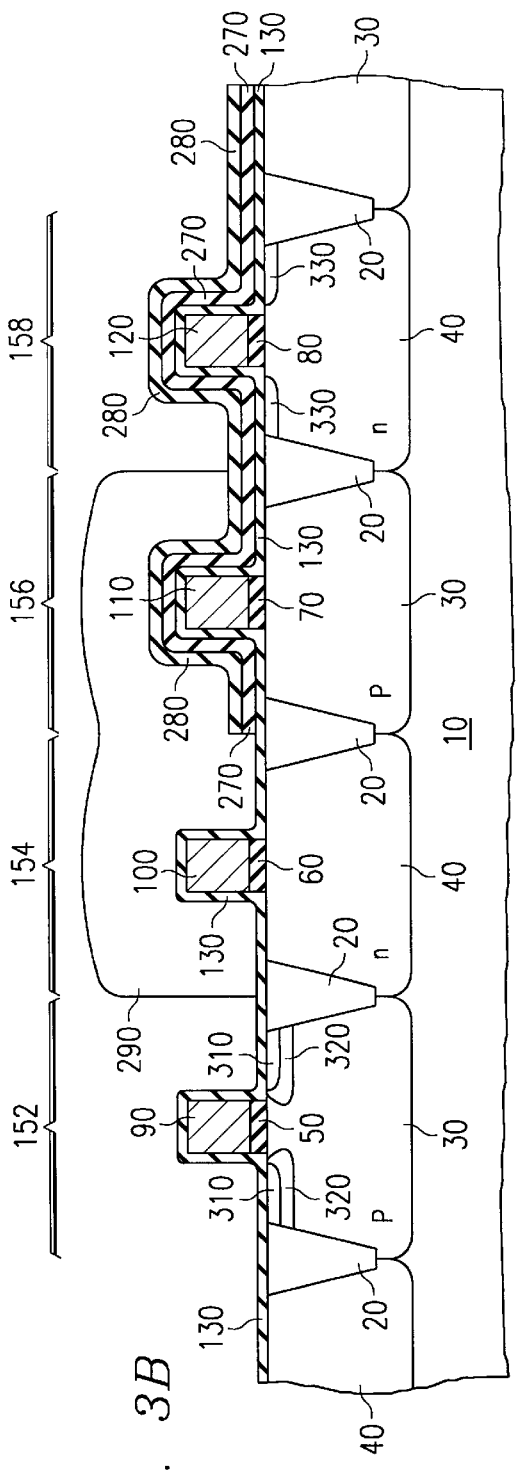
FIG. 3A
FIG. 3B

USE OF A THIN NITRIDE SPACER IN A SPLIT GATE EMBEDDED ANALOG PROCESS

This application claims priority under 35 USC §119 (e) (1) of provisional application Serial No. 60/239,050, filed Oct. 10, 2000.

FIELD OF THE INVENTION

The invention is generally related to the field of MOSFET transistors and more specifically to a novel process to achieve high performance core transistor, input-output transistor, and analog transistor performance with reduced mask steps.

BACKGROUND OF THE INVENTION

For mixed voltage technologies, e.g. low voltage core transistors with operating voltages of about 1.8 volts to 1.2 V and high voltage input-output (I/O) transistors with operating voltages of about 3.3 volts to 2.5 volts, it is difficult to achieve both high reliability and high performance for both the core transistors and the I/O transistors without adding extra mask steps to independently optimize the core transistors and the I/O transistors. The same concerns apply to the cases where analog MOSFET transistors are embedded with the core transistors and the high voltage I/O transistors.

The higher operating voltages of the I/O transistors and the analog transistors make them susceptible to hot carrier degradation. To reduce this effect, a lightly doped drain (LDD) or drain extension is utilized. In this disclosure, LDD will be used to represent any drain extension type implant. The drain extension typically extend the heavily doped source and drain regions further under the gate of the transistor. In some applications, this LDD is formed using a low dose, high energy arsenic implant which results in acceptable reliability for the high voltage NMOS I/O transistor and the analog transistor. In an effort to reduce masking steps, this low dose, high energy arsenic implant can also be used to form the LDD structure in the low voltage core NMOS transistor. However, this LDD structure will significantly degrade the core NMOS transistor drive current ($I_{drive}$), most notably, as the drain supply voltage (VDD) for the core is scaled down from about 1.8 volts to about 1.2 volts. This drive current degradation is most probably due to the increase in the series resistance ($R_s R_d$) present in the source and drain and the associated LDD structure. As the drain supply voltage is reduced, the drive current will become increasingly limited by the this series resistance.

Thus the LDD structure required for achieving high reliability in the high voltage NMOS I/O transistors and analog transistors will severely degrade the $I_{drive}$ in the low voltage NMOS core transistors due to high series resistance $R_s R_d$ and damage from the high energy arsenic implant. Present integrated circuit fabrication methodologies necessitates the use of additional masking steps to separately optimize all the transistors. There is therefore great need for a reduced masking step process that will optimize all the transistors and result in both high reliability and high performance without the high cost associated with increased masking steps.

SUMMARY OF THE INVENTION

The instant invention is a mixed voltage CMOS method for high reliability and high performance core, input-output, and analog transistors with reduced masks. In particular, the instant invention comprises forming a nitride film selectively over NMOS and PMOS type transistors and implanting these transistors through a mask to simultaneously form LDD regions in the various transistors.

An advantage of the instant invention is that no masking steps are required for forming the mixed voltage integrated circuits. Another advantage of the instant invention is that no additional implants are required other than those required for forming the core transistors. Another advantage of the instant invention is that the pocket implant of one transistor device type will be used as the drain extension of the other transistor device type.

These and other advantages will be apparent to those of ordinary skill in the art having reference to the specification in conjunction with the drawings.

BRIEF DESCRIPTION OF THE DRAWINGS

In the drawings:

FIGS. 2A–2B are cross-sectional diagrams showing another embodiment of the instant invention.

FIGS. 3A–3C are cross-sectional diagrams showing a further embodiment of the instant invention.

Figure 1A:
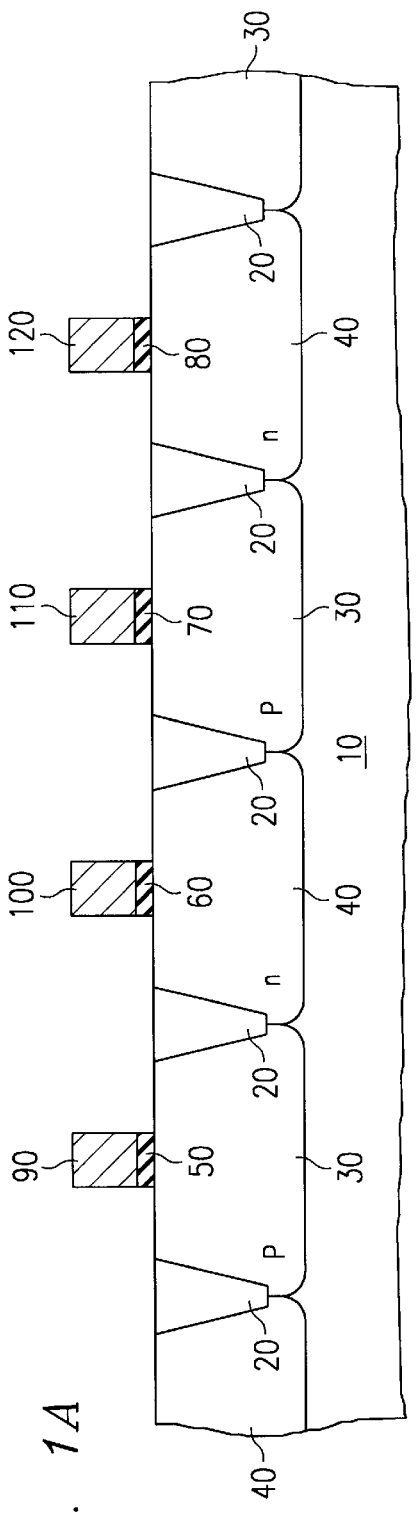
FIGS. 1A–1D are cross-sectional diagrams showing an embodiment of the instant invention.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1–3, the instant invention can be utilized in any semiconductor device structure. The methodology of the instant invention provides a solution to obtain performance and reliable high voltage I/O transistors and analog transistors simultaneously with high performance, low voltage core transistors with no extra mask steps.

The following description of the instant invention will be related to FIGS. 1A–1D. Referring to FIG. 1A, a substrate 10 is provided and a number of n-type 40 and p-type 30 wells are formed in the substrate 10. The transistors that comprise the integrated circuit are formed in these wells. Gate stacks are formed on the various well structures which will be used to form the various core, I/O, and analog transistors that comprise that integrated circuit. As shown in FIG. 1A, the gate dielectric 50 and the gate electrode 90 forms the gate stack of the core NMOS transistor. The gate dielectric 60 and the gate electrode 100 forms the gate stack of the core PMOS transistor. The gate dielectric 70 and the gate electrode 110 forms the gate stack for and NMOS analog device or and NMOS I/O device. The gate dielectric 80 and the gate electrode 120 forms the gate stack for a PMOS analog device or a PMOS I/O device. The gate dielectric films 50, 60, 70, and 80 may be comprised of an oxide, thermally grown SiO2, a nitride, an oxynitride, or any combination thereof. The films can comprise different thickness' depending on the required device properties and are preferably on the order of 1 to 40 nm thick. The gate electrodes 90, 100, 110, and 120 comprise a silicon containing material which is preferably polycrystalline silicon ("poly" or "polysilicon"), but may also comprise epitaxial silicon or any other semiconducting material. The substrate may also contain isolation structures 20 required to electrically isolate the active devices from one another on the substrate. These isolation structures 20 may comprise an oxide or some other insulator.

Figure 1B:
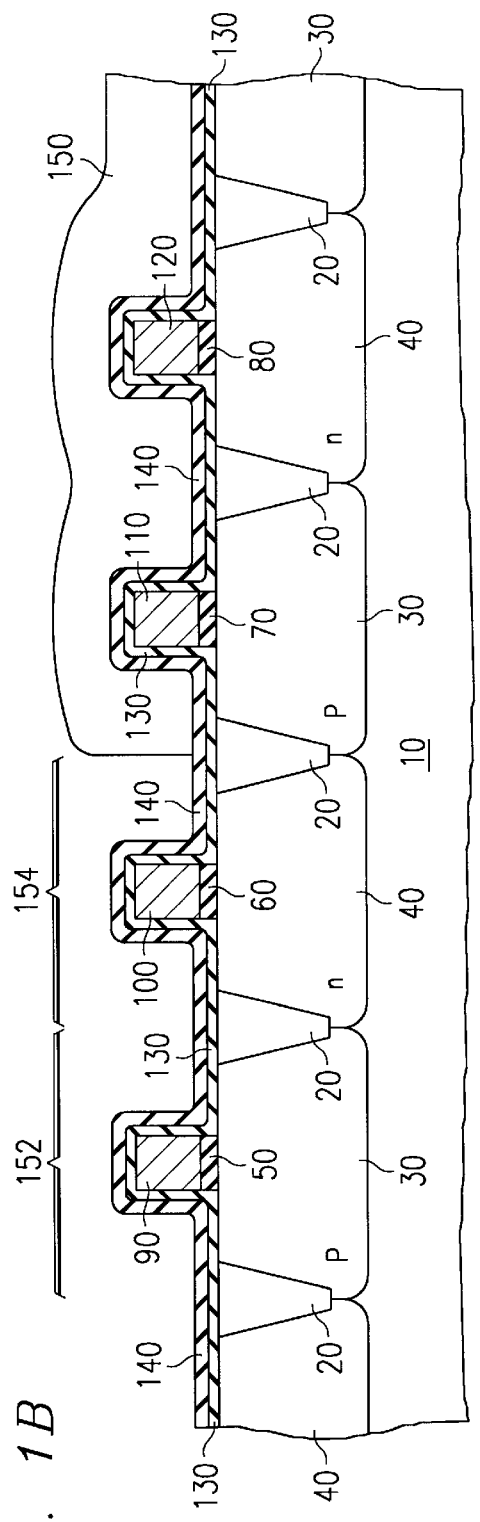
Figure 1C:
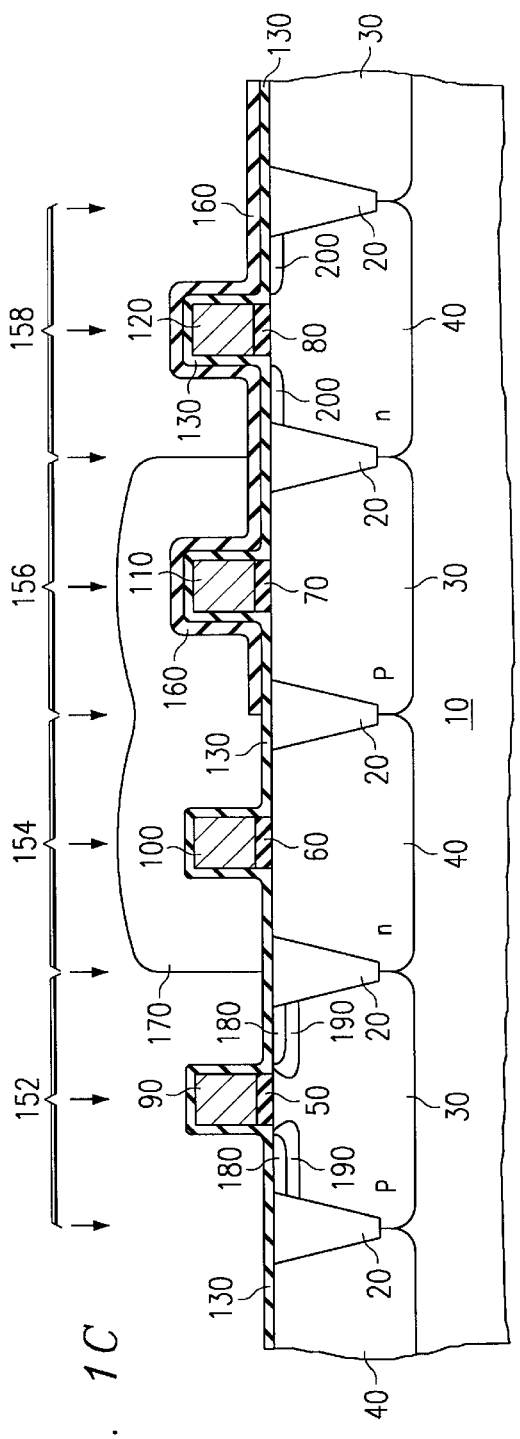
Figure 1D:
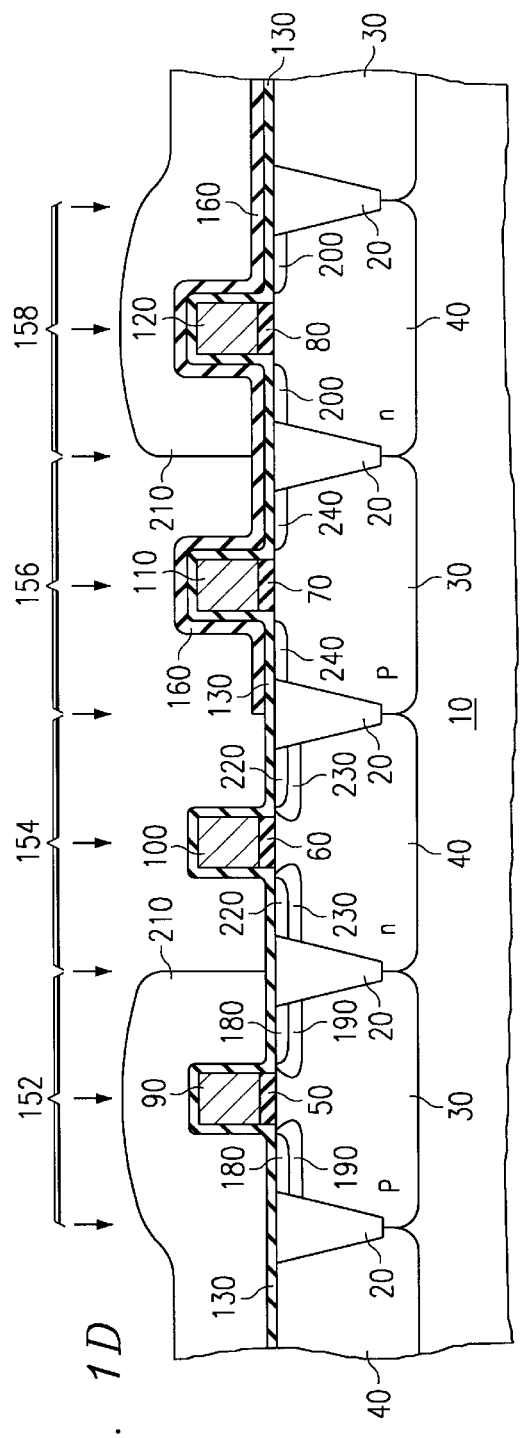

Following the formation of the gate stacks, a dielectric film 130 is formed on the gate stacks and substrate 10 as shown in FIG. 1B. In an embodiment of the instant invention this dielectric film 130 comprises silicon oxide, silicon oxynitride, and is preferably silicon oxide (or oxide). The oxide film 130 is preferably formed by thermal oxidation and is typically 1–10 nm thick. Following the formation of the oxide film 130, a thin silicon nitride film 140 is formed over the oxide film 130. This silicon nitride film 140 is preferably about 1–200 nm thick. As shown in FIG. 1B, a photoresist film is formed and patterned 150 to expose the gate stacks of the core NMOS transistors 152 and the core PMOS transistor during the subsequent nitride etch. The nitride etch is preferably a dry etch process that has a high selectivity (greater than 1.5 to 1) to the oxide film 130 beneath the nitride film 140. The patterned nitride film 160 formed after the nitride etch is shown in FIG. 1C. Following the formation of the patterned nitride film 160 and the removal of the patterned photoresist 150, photoresist is formed and patterned 170 to expose the NMOS core transistor 152 and the PMOS I/O or analog transistor 158 to the NMOS core transistor lightly doped drain (LDD) and pocket implants. The NMOS core LDD implant is typically a low energy n-type implant. This n-type implant can comprise arsenic, antimony, or phosphorous. In an embodiment of the instant invention this NMOS core LDD implant comprises an arsenic implant with a dose range of $0.5 \times 10^{16}$ cm$^{-2}$ to $1 \times 10^{18}$ cm$^{-2}$ and an energy range of 1 to 10 KeV. This implant will form the LDD region 180 in the core NMOS transistor 152 as shown in FIG. 1C. The implant will be blocked by the patterned nitride film 160 which remains over the PMOS I/O or analog device 158 and will not enter the substrate 10. Following the NMOS core LDD implant, a core NMOS pocket implant is performed. This core NMOS pocket implant comprises a p-type implant. This p-type implant can comprise boron, BF$_2$, gallium, and indium. In an embodiment of the instant invention, this pocket implant comprises implanting boron at energies between 10 KeV and 40 KeV with doses between $1 \times 10^{13}$ cm$^{-2}$ and $5 \times 10^{15}$ cm$^{-2}$. This pocket implant forms the pocket region 190 in the core NMOS transistor 152 and penetrates the patterned nitride film 160 to form the drain extension region 200 in the PMOS I/O or analog transistor 158. Following core NMOS LDD and pocket implants, the photoresist film 170 is removed and another patterned photoresist film is formed 210 which exposes the core PMOS transistor 154 and the NMOS I/O or analog transistor 156 to the core PMOS LDD and pocket implants. This patterned photoresist film 210 is illustrated in FIG. 1D. The core PMOS LDD implant is a p-type implant which can comprise boron, BF$_2$, gallium, and indium. In an embodiment of the instant invention, the core PMOS LDD implant comprises a BF$_2$ implant at energies between 2 KeV and 10 KeV with doses between $1 \times 10^{14}$ cm$^{-2}$ and $1 \times 10^{16}$ cm$^{-2}$. This implant forms The LDD region 220 in the core PMOS structure 154. Due to the relatively low energy of the implant, the implant is blocked by the patterned nitride film 160 from entering the NMOS I/O or analog device 156. The pocket region 230 in the PMOS core transistor is formed using a n-type implant of phosphorous, arsenic or antimony. In an embodiment of the instant invention, a phosphorous implant is used to form the pocket region 230 in the core PMOS transistor. This phosphorous implant comprises energies of 20 KeV to 60 KeV and doses of $5 \times 10^{12}$ cm$^{-2}$ to $1 \times 10^{15}$ cm$^{-2}$. The phosphorous implant can penetrate the patterned nitride film 160 and forms the LDD region 240 for the NMOS I/O or analog device 156. Following the formation of the NMOS I/O or analog LDD regions 240, the transistors are completed using standard CMOS processing. The above described embodiment of the instant invention uses three masking levels to form the core and I/O or analog transistors compared to the four masking levels used in standard processes.

Shown in FIGS. 2A–2B is another embodiment of the instant invention. With the substrate 10, wells 30, 40 and gate stacks formed as described above, a dielectric film 130 is formed on the substrate 10. In an embodiment of the instant invention this dielectric film 130 comprises silicon oxide, silicon oxynitride, and is preferably silicon oxide (or oxide). The oxide film 130 is preferably formed by thermal oxidation and is typically 1–10 nm thick. Following the oxide film formation 130, a photoresist mask is used block transistors 154, 156, and 158 while implanting the core NMOS transistor 152 to form the LDD region 370 and the pocket region 380. The LDD region 370 is formed using a n-type implant of arsenic, phosphorous, or antimony and the pocket region 380 is formed using a p-type implant of boron, BF$_2$, gallium, or indium. In an embodiment of the instant invention this NMOS core LDD implant comprises an arsenic implant with a dose range of $0.5 \times 10^{16}$ cm$^{-2}$ to $1 \times 10^{18}$ cm$^{-2}$ and an energy range of 1 to 10 KeV and the pocket implant comprises implanting boron at energies between 10 KeV and 40 KeV with doses between $1 \times 10^{13}$ cm$^{-2}$ and $5 \times 10^{15}$ cm$^{-2}$. Following the formation of regions 370 and 380, a blanket nitride film 140 is formed on the substrate 10. A photoresist film is formed and patterned 390 to cover the NMOS I/O or analog transistor 156 during the subsequent nitride etch. The nitride etch is preferably a dry etch process that has a high selectivity (greater than 1.5 to 1) to the oxide film 130 beneath the nitride film 140. The patterned nitride film 400 formed after the nitride etch is shown in FIG. 1B. Following the formation of the patterned nitride film 400, a photoresist film is formed and patterned 410 to mask the core NMOS transistor 152 and the PMOS I/O or analog transistor 158 from the core PMOS pocket and LDD implants. The core PMOS LDD implant comprises a p-type implant of boron, BF$_2$, gallium, or indium. In an embodiment of the instant invention, the core PMOS LDD implant comprises a BF$_2$ implant at energies between 2 KeV and 10 KeV with doses between $1 \times 10^{14}$ cm$^{-2}$ and $1 \times 10^{16}$ cm$^{-2}$. This implant forms The LDD region 420 in the core PMOS structure 154. Due to the relatively low energy of the implant, the implant is blocked by the patterned nitride film 400 from entering the NMOS I/O or analog device 156. The pocket region 430 in the PMOS core transistor is formed using a n-type implant of phosphorous, arsenic or antimony. In an embodiment of the instant invention, a phosphorous implant is used to form the pocket region 430 in the core PMOS transistor. This phosphorous implant comprises energies of 20 KeV to 60 KeV and doses of $5 \times 10^{12}$ cm$^{-2}$ to $1 \times 10^{15}$ cm$^{-2}$. The phosphorous implant can penetrate the patterned nitride film 400 and forms the LDD region 440 for the NMOS I/O or analog device 156. In addition, an antimony implant can be performed to aid in the formation of the silicide region in later device processes. Following the formation of the LDD region 440 for the PMOS I/O or analog transistor 156, the patterned photoresist 410 is removed and a blanket p-type implant is performed to form the LDD region of the PMOS I/O or analog transistor 158. The above described embodiment of the instant invention uses three masking levels to form the core and I/O or analog transistors compared to the four masking levels used in standard processes.

Figure 3C:
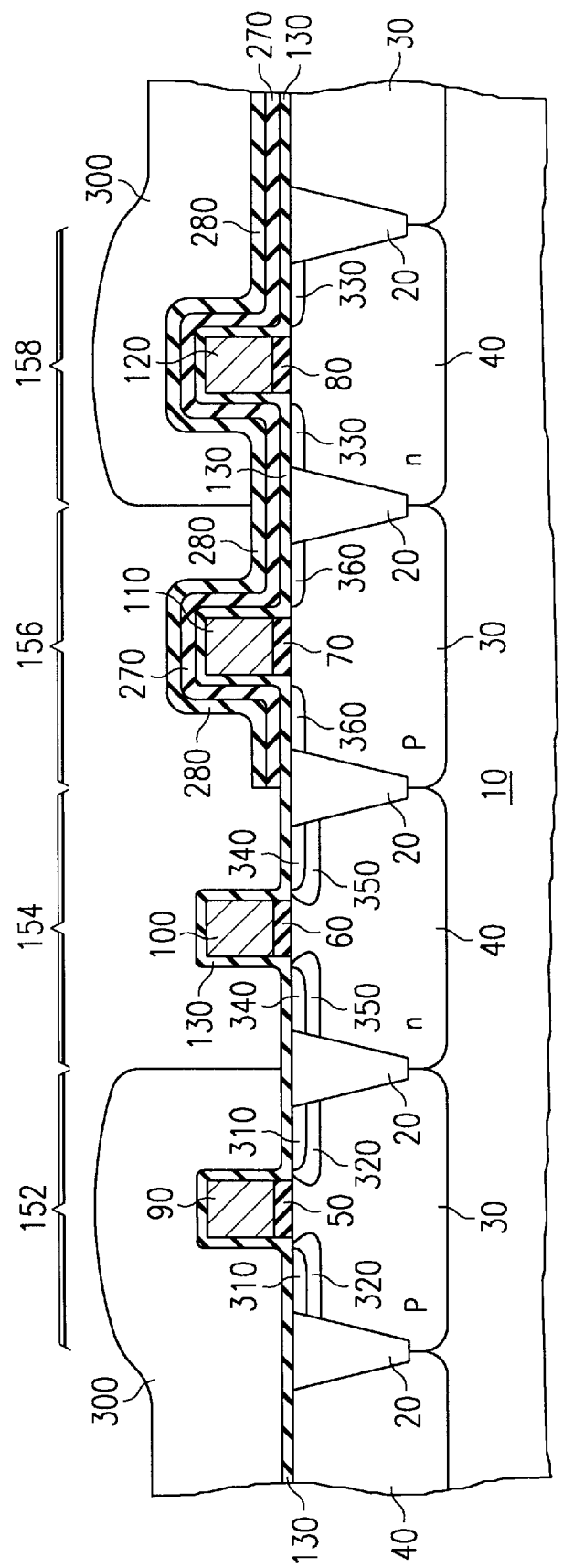

Shown in FIGS. 3A–3C is a further embodiment of the instant invention. With the substrate 10, wells 30, 40 and gate stacks formed as described above, a dielectric film 130 is formed on the substrate 10. In an embodiment of the instant invention this dielectric film 130 comprises silicon oxide, silicon oxynitride, and is preferably silicon oxide (or oxide). The oxide film 130 is preferably formed by thermal oxidation and is typically 1–10 nm thick. Following the formation of the oxide film 130, a thin silicon nitride film 140 is formed over the oxide film 130. This silicon nitride film 140 is preferably about 1–200 nm thick. Following the formation of the nitride film 140, a second oxide film 250 is formed on the nitride film 140. This second oxide film 250 is preferably formed using chemical vapor deposition and is typically 1–50 nm thick. As shown in FIG. 3A, a photoresist film is formed and patterned 260 to expose the gate stacks of the core NMOS transistors 152 and the core PMOS transistor during the subsequent oxide etch. Following the oxide etch the patterned photoresist 260 is removed and nitride etch is performed. The nitride etch is preferably a wet etch process comprising hot phosphoric acid. This wet etch is highly selective to oxide and removes the nitride film from over the core NMOS transistors 152 and the core PMOS transistors 154. The patterned nitride film 270 and the patterned oxide film 280 formed after the respective nitride and oxide etch processes are shown in FIG. 3B. Following the formation of the patterned nitride film 270, photoresist is formed and patterned 290 to expose the NMOS core transistor 152 and the PMOS I/O or analog transistor 158 to the NMOS core transistor lightly doped drain (LDD) and pocket implants. The NMOS core LDD implant is typically a low energy n-type implant. In an embodiment of the instant invention this NMOS core LDD implant comprises an arsenic implant with a dose range of $0.5\times10^{16}$ cm$^{-2}$ to $1\times10^{18}$ cm$^{-2}$ and an energy range of 1 to 50 KeV. form the LDD region 310 in the core NMOS transistor 152 as shown in FIG. 3B. The implant will be blocked by the patterned nitride film 270 and the patterned second oxide film 280 which remains over the PMOS I/O or analog device 158 and will not enter the substrate 10. Following the NMOS core LDD implant, a core NMOS pocket implant is performed. This core NMOS pocket implant comprises a p-type implant. In an embodiment of the instant invention, this pocket implant comprises implanting boron at energies between 10 KeV and 40 KeV with doses between $1\times10^{13}$ cm$^{-2}$ and $5\times10^{15}$ cm$^{-2}$. This pocket implant forms the pocket region 320 in the core NMOS transistor 152 and penetrates the patterned nitride film 160 and second oxide film 280 to form the drain extension region 330 in the PMOS I/O or analog transistor 158. Following Core NMOS LDD and pocket implants, the photoresist film 290 is removed and another patterned photoresist film is formed 300 which exposes the core PMOS transistor 154 and the NMOS I/O or analog transistor 156 to the core PMOS LDD and pocket implants. This patterned photoresist film 300 is illustrated in FIG. 3C. The core PMOS LDD implant comprises a p-type implant. In an embodiment of the instant invention, the core PMOS LDD implant comprises a BF$_2$ implant at energies between 2 KeV and 40 KeV with doses between $1\times10^{14}$ cm$^{-2}$ and $1\times10^{16}$ cm$^{-2}$. This implant forms the LDD region 340 in the core PMOS structure 154. Due to the relatively low energy of the implant, the implant is blocked by the patterned nitride film 270 and the patterned oxide film 280 from entering the NMOS I/O or analog device 156. The pocket region 350 in the PMOS core transistor is formed using a n-type implant. In an embodiment of the instant invention, a phosphorous implant is used to form the pocket region 350 in the core PMOS transistor. This phosphorous implant comprises energies of 20 KeV to 80 KeV and doses of $5\times10^{12}$ cm$^{-2}$ to $1\times10^{15}$ cm$^{-2}$. The phosphorous implant can penetrate the patterned nitride film 270 and patterned oxide film 280 and forms the LDD region 360 for the NMOS I/O or analog device 156. Following the formation of the NMOS I/O or analog LDD regions 360, the transistors are completed using standard CMOS processing. The above described embodiment of the instant invention uses three masking levels to form the core and I/O or analog transistors compared to the four masking levels used in standard processes. The above described embodiment of the instant invention uses three masking levels to form the core and I/O or analog transistors compared to the four masking levels used in standard processes.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:
1. A method of fabricating an embedded integrated circuit, comprising the steps of:
   providing a semiconductor substrate with a plurality of gate stacks;
   forming a first dielectric film on said semiconductor substrate and gate stacks;
   forming a silicon nitride film on said first dielectric film;
   selectively removing said silicon nitride film from over a first type of NMOS transistor and a first type of PMOS transistor thereby leaving said silicon nitride film over a second type of NMOS transistor and a second type of PMOS transistor;
   forming a first patterned film such that said first type of NMOS transistor and said second type of PMOS transistor is exposed and said first type of PMOS transistor and said second type of NMOS transistor is covered;
   implanting said first type of NMOS transistor with a n-type species to form LDD structures in said first type of NMOS transistor wherein said n-type species is blocked by said silicon nitride film and does not enter said second type of PMOS transistor; and
   implanting said first type of NMOS transistor with a p-type species to form pocket regions in said first type of NMOS transistor wherein said p-type species penetrates said silicon nitride film and simultaneously forms LDD structures in said second type of PMOS transistor.
2. The method of claim 1 further comprising:
   forming a second patterned film such that said first type of PMOS transistor and said second type of NMOS transistor is exposed and said first type of NMOS transistor and said second type of PMOS transistor is covered;
   implanting said first type of PMOS transistor with a p-type species to form LDD structures in said first type of PMOS transistor wherein said p-type species is blocked by said silicon nitride film and does not enter said second type of NMOS transistor; and
   implanting said first type of PMOS transistor with a n-type species to form pocket regions in said first type of PMOS transistor wherein said n-type species penetrates said silicon nitride film and simultaneously forms LDD structures in said second type of NMOS transistor.

3. The method of claim 1 wherein said first dielectric film is a silicon oxide.

4. The method of claim 1 wherein said selectively removing said silicon nitride film comprises forming a patterned photoresist film and using a dry silicon nitride etch process.

5. The method of claim 1 wherein said n-type species is selected from the group consisting of: phosphorous, arsenic, antimony and any combination thereof.

6. The method of claim 1 wherein said p-type species is selected from the group consisting of: boron, BF2, gallium, indium, and any combination thereof.

7. A method of fabricating an embedded integrated circuit, comprising the steps of:
- providing a semiconductor substrate with a plurality of gate stacks;
- forming a first dielectric film on said semiconductor substrate and gate stacks;
- forming a silicon nitride film on said first dielectric film;
- forming a second dielectric film on said silicon nitride film;
- selectively removing said second dielectric film and silicon nitride film from over a first type of NMOS transistor and a first type of PMOS transistor thereby leaving said second dielectric film and said silicon nitride film over a second type of NMOS transistor and a second type of PMOS transistor;
- forming a first patterned film such that said first type of NMOS transistor and said second type of PMOS transistor is exposed and said first type of PMOS transistor and said second type of NMOS transistor is covered;
- implanting said first type of NMOS transistor with a n-type species to form LDD structures in said first type of NMOS transistor wherein said n-type species is blocked by said second dielectric film and said silicon nitride film and does not enter said second type of PMOS transistor; and
- implanting said first type of NMOS transistor with a p-type species to form pocket regions in said first type of NMOS transistor wherein said p-type species penetrates said second dielectric film and said silicon nitride film and simultaneously forms LDD structures in said second type of PMOS transistor.

8. The method of claim 7 further comprising:
- forming a second patterned film such that said first type of PMOS transistor and said second type of NMOS transistor is exposed and said first type of NMOS transistor and said second type of PMOS transistor is covered;
- implanting said first type of PMOS transistor with a p-type species to form LDD structures in said first type of PMOS transistor wherein said p-type species is blocked by said second dielectric film and said silicon nitride film and does not enter said second type of NMOS transistor; and
- implanting said first type of PMOS transistor with a n-type species to form pocket regions in said first type of PMOS transistor wherein said n-type species penetrates said second dielectric film and said silicon nitride film and simultaneously forms LDD structures in said second type of NMOS transistor.

9. The method of claim 7 wherein said first dielectric film is a silicon oxide.

10. The method of claim 7 wherein said selectively removing said silicon nitride film comprises using a wet etch process.

11. The method of claim 7 wherein said n-type species is selected from the group consisting of: phosphorous, arsenic, antimony and any combination thereof.

12. The method of claim 7 wherein said p-type species is selected from the group consisting of: boron, BF2, gallium, indium, and any combination thereof.

13. The method of claim 7 wherein said second dielectric film is a silicon oxide.

14. A method of fabricating an embedded integrated circuit, comprising the steps of:
- providing a semiconductor substrate with a plurality of gate stacks;
- forming a first dielectric film on said semiconductor substrate and gate stacks;
- forming LDD regions on a first type of NMOS transistor;
- forming pocket regions on said first type of NMOS transistor;
- forming a silicon nitride film on said first dielectric film;
- selectively removing said silicon nitride film from over said first type of NMOS transistor and a first type of PMOS transistor and a second type of PMOS transistor thereby leaving said silicon nitride film over a second type of NMOS transistor;
- forming a first patterned film such that said first type of PMOS transistor and said second type of NMOS transistor is exposed and said first type of NMOS transistor and said second type of PMOS transistor is covered;
- implanting said first type of PMOS transistor with a p-type species to form LDD structures in said first type of PMOS transistor wherein said P-type species is blocked by said silicon nitride film and does not enter said second type of NMOS transistor; and
- implanting said first type of PMOS transistor with a n-type species to form pocket regions in said first type of PMOS transistor wherein said n-type species penetrates said silicon nitride film and simultaneously forms LDD structures in said second type of NMOS transistor.

15. The method of claim 14 wherein said first dielectric film is a silicon oxide.

16. The method of claim 14 wherein said selectively removing said silicon nitride film comprises forming a patterned photoresist film and using a dry silicon nitride etch process.

17. The method of claim 14 wherein said n-type species is selected from the group consisting of: phosphorous, arsenic, antimony and any combination thereof.

18. The method of claim 14 wherein said p-type species is selected from the group consisting of: boron, BF2, gallium, indium, and any combination thereof.

* * * * *